United States Patent
Tanaka et al.

(10) Patent No.: US 7,522,078 B2
(45) Date of Patent: Apr. 21, 2009

(54) METHOD OF GENERATION AND METHOD OF DETECTION OF INTERBAND PHASE DIFFERENCE SOLITION AND INTERBAND PHASE DIFFERENCE CIRCUIT

(75) Inventors: Yasumoto Tanaka, Tsukuba (JP); Akira Iyo, Tsukuba (JP); Adrian Crisan, Tsukuba (JP); Kazuyasu Tokiwa, Tokyo (JP); Tsuneo Watanabe, Tokyo (JP); Norio Terada, Kagoshima (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 50 days.

(21) Appl. No.: 11/845,420

(22) Filed: Aug. 27, 2007

(65) Prior Publication Data

US 2008/0051291 A1    Feb. 28, 2008

(30) Foreign Application Priority Data

Aug. 28, 2006   (JP)   .............................. 2006-230366

(51) Int. Cl.
*H03M 1/00* (2006.01)
(52) U.S. Cl. ............................ 341/133; 257/31; 257/34
(58) Field of Classification Search ................. 341/133; 257/31

See application file for complete search history.

(56) References Cited

U.S. PATENT DOCUMENTS 4,361,768 A * 11/1982 Rajeevakumar ............. 327/367

(Continued)

FOREIGN PATENT DOCUMENTS

JP    2003-209301    7/2003

(Continued)

OTHER PUBLICATIONS

Y. Tanaka, "Soliton in Two-Band Superconductor", Physical Review Letters, vol. 88, No. 1, Jan. 7, 2002, pp. 017002-1 -017002-3.

(Continued)

*Primary Examiner*—Khai M Nguyen
(74) *Attorney, Agent, or Firm*—Oblon, Spivak, McClelland, Maier & Neustadt, P.C.

(57) ABSTRACT

The length portion of part of a multiband superconductor line 10 is used as a closed circuit line part Rc that constitutes part of a closed circuit allowing passage of an electric current Io generated by an electric current source 12. Meantime, the line part extending and continuing into the closed circuit line part Rc is used as an open circuit line part Ro adapted to serve as an open circuit regarding the electric current source 12. By keeping the multiband superconductor line 10 under a temperature environment falling short of the critical soliton temperature and injecting a nonequilibrium electric current Io from the electric current source 12 into the closed circuit line part of the multiband superconductor line, it is rendered possible to induce generation of an interband phase different soliton So. The generated interband phase difference soliton So is forwarded as separated from the electric current Io to the open circuit line part Ro and is made to run therein. The open circuit line part Ro is provided with a Josephson junction 15 and consequently enabled to induce extinction of the interband phase different soliton So that has advanced thereto, during which time the voltage generated by the AC Josephson effect is detected with the voltage detecting device 13.

3 Claims, 4 Drawing Sheets

U.S. PATENT DOCUMENTS

| | | | | |
|---|---|---|---|---|
| 5,869,846 | A | * | 2/1999 | Higashino et al. ............. 257/31 |
| 6,838,694 | B2 | * | 1/2005 | Esteve et al. .................. 257/34 |
| 6,885,325 | B2 | * | 4/2005 | Omelyanchouk et al. ... 341/133 |
| 7,400,282 | B2 | * | 7/2008 | Tanaka et al. ............... 341/133 |

FOREIGN PATENT DOCUMENTS

| | | |
|---|---|---|
| JP | 2005-85971 | 3/2005 |

OTHER PUBLICATIONS

A. Gurevich, et al., "Interband Phase Modes and Nonequilibrium Soliton Structures in Two-Gap Superconductors", Physical Review Letters, vol. 90, No. 4, Jan. 31, 2003, pp. 047004-1 -047004-4.

Toshimitsu Morooka, et al., "Squid Microscope", Applied Physics, vol. 70, No. 1, 2001, pp. 50-52 (with English Translation).

Michael Tinkham, "Introduction to Superconductivity", $2^{ND}$ Edition, McGraw-Hill International Editions, Section 6.3, pp. 202-213.

H. Hilgenkamp, et al., "Grain Boundaries in High-T c Superconductors", Reviews of Modern Physics, vol. 74, Apr. 2002, pp. 485-549.

Y. Kopelevich, et al., "Nonlocal in-Plane Resistance Due to Vortex-Antivortex Dynamics in High-T c Superconducting Films", Physical Review Letters, vol. 80, No. 18, May 4, 1998, pp. 4048-4051.

F. Mrowka, et al., "Excess Voltage in The Vicinity of The Superconducting Transition in Inhomogeneous $YBa_2Cu_3O_7$ Thin Films", Physica C 399, 2003, pp. 22-42.

\* cited by examiner

Electric Current (A) of Electric Current Source 12

Voltage (V) of Electric Current Source 12

METHOD OF GENERATION AND METHOD OF DETECTION OF INTERBAND PHASE DIFFERENCE SOLITON AND INTERBAND PHASE DIFFERENCE CIRCUIT

BACKGROUND OF THE INVENTION

1. Field of the Invention

This invention relates to a method of generation and a method of detection of a soliton in an interband phase difference soliton circuit that is one of superconducting circuits and an interband phase difference soliton circuit befitting realization of these methods.

2. Description of the Prior Art

The superconducting electronics that utilize the phase difference among a plurality of superconducting components by means of a multiband superconductor have been disclosed in the first and second prior art references (JP-A 2003-209301 and JP-A 2005-085971) in which the inventors of the present application have taken part.

The bits serving as a base element in their operations are formed by utilizing the quanta behaving as solitary waves, namely interband phase difference solitons (hereinafter abbreviated simply as "soliton" unless otherwise specified). The development of efficient methods of generation and detection of the soliton is a technique that bases these electronics. The term "interband phase difference soliton" as used herein refers to the soliton that is devoid of a quantized magnetic flux (fraxon) producing a motion in a one-dimensionally long Josephson junction. The fraxon accompanies a cyclic electric current within the real space. In contrast, the interband phase difference does not form a quantized magnetic flux because it possesses no cyclic electric current in the real space despite its possession of a cyclic electric current in the wavenumber space (otherwise called "momentum space").

As regards the generation, however, as disclosed in the first and second prior art references cited above and in the third prior art reference ("Soliton in Two-Band Superconductor," Y. Tanaka, Physical Review Letters, Vol. 88, Number 1, 017002), a method for creating a boundary condition for the generation of a soliton with a magnetic field has been proposed and, as disclosed in the fourth prior art reference ("Interband Phase Modes and Nonequilibrium Soliton Structures in Two-Gap Superconductors," A. Gurevich and V. M. Vinokur, Physical Review Latters, Vol. 90, Number 4, 047004), a method for creating a soliton together with an electric current by causing inflow of a nonequilibrium electric current into a superconductor has been proposed.

Meanwhile, concerning the detection, the first to third prior art references disclose a method for detecting the generation of a halfway magnetic flux quantum (Fractional Flux) generated by the soliton and the fourth prior art reference discloses the generation of a voltage due to the counter extinction of a soliton and an antisoliton and a method for detecting a soliton with the voltage that is generated when a soliton is created at an electric current introducing terminal.

The method for generating a soliton by means of boundary conditions dependent on a magnetic field, however, has been at a disadvantage in readily succumbing to the influence of the external field of environment because it is required to use direct mutual action of a soliton and a magnetic field. Further, in the first place, since the "interband phase difference soliton" does not possess the cyclic electric current accompanying a real electric current in the real space, the soliton involved in any of the scenes of the first to third prior art references by nature avoids inducing a mutual action with a magnetic field. Since this fact has been admitted as an advantageous point in the application to a quantum computer, the procedure that necessitates setting boundary conditions dependent on a magnetic field forms a cause for impairing this advantage.

Further, the soliton is created in a closed circuit for the sake of preparing boundary conditions. At this time, the spontaneous electric current that flows in the closed circuit overlaps the soliton. For the purpose of purely extracting the soliton alone, the closed circuit must be built by constructing a switch part within part of the line of the closed circuit and turning off the switch. The formation of this switch part is not simple.

Meanwhile, even when the soliton has been obtained by injecting a nonequilibrium electric current from outside, a method for separating the soliton and the electric current becomes necessary. This method has never been known heretofore.

The detection of the soliton also entails various problems. When a method for detecting a halfway magnetic flux quantum is adopted, a highly advanced technique for determining a magnetic field is required. As means that promises usefulness for the determination of a magnetic flux smaller than the unit quantum magnetic flux, the SQUID microscope disclosed in the fifth prior art reference ("SQUID Microscope," Toshimitsu Morooka and Kazuo Chinone, Applied Physics, Vol. 70, No. 1, (2001), pp. 50-52) is available. This microscope is at a disadvantage in consuming undue time in the determination of a magnetic flux and suffering the soliton to become extinct before completion of the determination. When the soliton stands still in a faultless or ideal sample, it is topologically stable. The soliton retains life, however, when the sample possesses imperfectness. The life of the soliton shortens particularly when the kinetic energy of the soliton is large. Even for the sake of enabling high-speed electronics, therefore, a means to detect soliton without relying on the method for determining a halfway magnetic flux quantum is needed.

The method that detects the generation of a voltage by the counter extinction of a soliton and an antisoliton as disclosed in the fourth prior art reference may well be called one of powerful methods for the detection of a soliton. This is nevertheless an instance observed during the generation of a soliton induced by the injection of a nonequilibrium electric current from outside. In consideration of the fact that the electric current and the soliton are in a mixed state within the superconductor line allowing running of the soliton, however, the voltage originating in the soliton and the voltage originating in the nonequilibrium electric current injected from outside are not easily separated because they take place in an overlapping state. The voltage signal due to the generation of the soliton at the electrode through which the nonequilibrium electric current is injected is likewise difficult to discern.

For the purpose of applying to the detection of a single soliton the concept of the generation of a voltage due to the counter extinction of a soliton and an antisoliton, it becomes necessary to find a point at which the antisoliton is allowed to flow in. This method has not been known heretofore.

In short, so long as a method capable of rationally and infallibly separating the soliton and the electric current is not available, the voltage signal attendant on the extinction of the soliton is difficult to discern because of the inevitable exposure to the large influence of the electric current. The difficulty encountered by the technique directed to generating and detecting the soliton also renders very difficult the search itself for a superconducting material that enables realizing electronics using the interband phase difference soliton. That is, even when this superconducting material needs to be tested for the purpose of determining whether it can be used for a soliton circuit, a reliable and easy method for performing this test has not been known heretofore.

This invention has been accomplished in view of such true state of prior art as described above and is aimed at providing a method and a circuit that enable accomplishing the object of generating and detecting a soliton without relying on a magnetic flux and with a simple structure, infallibly separating an electric current and a soliton within a superconducting line and dispensing with the susceptibility to the influence of an electric current even during the detection of a soliton.

SUMMARY OF THE INVENTION

This invention, with a view to accomplishing the object mentioned above, basically provides as the first aspect thereof a method for generating a soliton, comprising the steps of using part of a length portion of a multiband superconductor line as a closed circuit line part that is part of a closed circuit for running an electric current generated by an electric current source; using a line part of the multiband superconductor line continuously extending to the closed circuit line part as an open circuit line part fated to serve as an open circuit with respect to the electric current source; and placing the multiband superconductor line under a temperature environment below a critical soliton temperature lower than a superconducting critical temperature of the multiband superconductor line, thereby injecting a nonequilibrium electric current from the electric current source into the closed circuit line part of the multiband superconductor line to induce generation of an interband phase difference soliton as separated from the electric current to the open circuit line part of the multiband superconductor line.

This invention provides as the second aspect thereof a method for detecting a soliton, including the method of the first aspect and further comprising the steps of forwarding the separated interband phase difference soliton to the open circuit line part of the multiband superconductor line to cause the soliton to run in the open circuit line part, providing the open circuit line part with a Josephson junction; and causing extinction of the soliton subsequent to its arrival at the Josephson junction and, at the time of the extinction, detecting a voltage generated in consequence of an AC Josephson effect, thereby enabling detection of the soliton.

This invention provides as the third aspect thereof a soliton circuit comprising a multiband superconductor line possessing a length; a pair of electrodes disposed as mutually separated in a portion of the length of the multiband superconductor line; an electric current source connected to the pair of electrodes; an open circuit line part forming a portion of the length of the multiband superconductor line, disposed as continued to a closed circuit line part fated to serve as part of a closed circuit relative to the electric current source, and adapted to form an open circuit relative to the electric current source; a Josephson junction disposed in the open circuit line part; a voltage detecting means adapted to detect voltage generated in the Josephson junction; and means to cool the multiband superconductor line to below a critical soliton temperature that is lower than a superconducting critical temperature.

This invention, substantially owing to a very simple structural contrivance, is enabled to attain extraction of the soliton as completely separated from an electric current that is made to flow into a multiband superconductor line for the purpose of generating a soliton. Now the difficulties encountered heretofore have been wholly solved by this invention, the soliton running part can perfectly be cut off the external field of environment without being affected by a magnetic field. As regards the detection of a generated soliton, since the generated soliton has already been separated from the electric current, it suffices just to have the multiband superconductor line provided in its open circuit line part with a Josephson junction and then proceed to detect a voltage that can be generated in that junction. Thus, the result of detection reveals high accuracy for the very simple structure. The necessity of performing the determination of a magnetic field that has entailed various complicated troubles and difficulties as hitherto is perfectly obviated.

Then, the fact that the soliton can be infallibly detected as described above conversely means that the multiband superconductor line used for the detection can be efficiently used for the purpose of judging whether it is a material suitable for infallibly generating a soliton. The study directed to determining what kind of material can be used as the multiband superconductor line, namely the "search" for the material befitting the multiband superconductor line, is also an important research issue. As a means for this search, this invention can be effectively utilized veritably.

The soliton circuit provided by this invention can mature into a veritably practical fundamental circuit structure promising to prosper in the future and can contribute immensely to the pertinent technical field.

DETAILED DESCRIPTION OF THE PREFERRED EMBODIMENT

Figure 1:
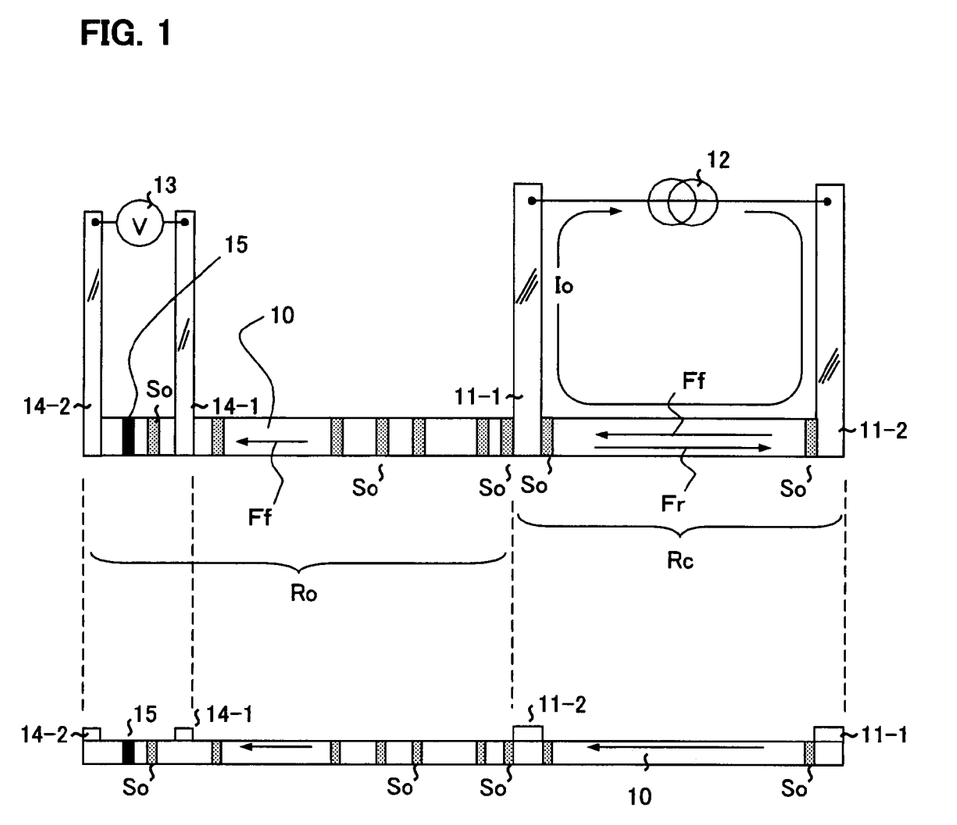
FIG. 1 is a schematic structural diagram illustrating one preferred embodiment of the soliton circuit contemplated by this invention.

FIG. 1 illustrates one example of the configuration of the fundamental circuit device of a soliton circuit to which this invention is applied. The upper stage depicts a plan view and the lower stage depicts a diagram of the lateral end face. First, there is a multiband superconductor line 10 possessing a length. This line 10 must be made of a material that enables the presence of solitons So (which will be simply abbreviated as "soliton" in accordance with the provision mentioned above and which exactly refers to "an interband phase difference soliton") to be generated as will be specifically described herein below. An example of the material that answers this description has been already provided by the study pursued by the present inventors and others. For example, the composition T1 $(Ba_xSr_{1-x})_2Ca_2Cu_3O_y$ (universally known under the code of "T1 -1223") that is one kind of multilayered high-temperature superconductor prepared in the form of a thin film by utilizing the technique disclosed in the sixth prior art reference (Japanese Patent No. 2923530) is available.

This multiband superconductor line 10 is provided in parts of its length with a pair of electrodes 11-1 and 11-2 separated with respect to one another and an electric current source 12 is connected between these electrodes. As a result, the part intervening between the pair of electrodes 11-1 and 11-2 in the multiband superconductor line 10 serves as a closed circuit line part Rc that constitutes one part of a closed circuit regarding the electric current source 12 and an electric current Io emanating from the electric current source 12 is allowed to flow through the closed circuit formed as described above. As depicted in the figure, the electric current Io generated by the electric current source 12 so behaves as to flow from the electrode 11-2 positioned on the right-hand side in the figure into the closed circuit line part Rc of the multiband superconductor line 10, pass through the closed circuit line part Rc and then cycle via the other electrode 11-1 into the electric current source 12.

Meantime, the line part falling on the left-hand side from the electrode 11-1 positioned in the middle part of the multiband superconductor line 10 in the bearings of the figure serves as an open circuit line part Ro that constitutes an open circuit relative to the electric current source 12. That is, the open circuit line part Ro that is meaningless relative to the electric current Io generated by the electric current source 12 is provided as connected to the closed circuit line part Rc.

Then, this open circuit line part Ro is provided with a Josephson junction 15 and is also provided with detecting means capable of detecting the voltage selectively generated in the junction. The voltage detecting means that is shown in the figure comprises a pair of electrodes 14-1 and 14-2 disposed on the open circuit line part Ro astraddle the Josephson junction 15 and a voltage detecting device 13 connected thereto. The microvoltage detecting device has been already known publicly in numerous kinds and, therefore, can be properly selected and put to use. At least the part of the multiband superconductor line 10 is cooled with means (not shown) capable of cooling to a temperature lower than a superconducting critical temperature Tc of the multiband superconductor line 10 and below a critical soliton temperature Tc2 (<Tc) at which a soliton So can exist stably. The critical soliton temperature Tc2 will be described more specifically herein below.

To describe the operation of the construction of the circuit device in conformity with this invention, the parts of the multiband superconductor line 10 through which the electric current supplied from the electric current source 12 flows in and flows out respectively, namely the parts of the pair of the electrodes 11-1 and 11-2, generate voltage in consequence of contact resistance. Though the material suitable for the electrodes is not limitative, gold may be cited for example. In the illustrated case, the electrodes 11-1 and 11-2 both made of gold are disposed respectively at the terminal parts of the opposite ends of the closed circuit line part Rc of the multiband superconductor line 10 in such a form as to contact one surface of the multiband superconductor line 10.

At such electrode parts, the contact resistance generates voltage, this voltage enables quasi-particles possessing high energy to be injected into the multiband superconductor line 10, and the quasi-particles thus injected give rise to the soliton So. As described in detail in the fourth prior art reference, since the quasi-particles induce deviation from the equilibrium value of the carrier ratio between the first band and the second band, an interband electric current (nonequilibrium electric current) flows between the bands so as to revert this deviation to the equilibrium value. When the interband electric current surpasses a certain fixed magnitude, the soliton So is liberated and caused to invade the interior of the multiband superconductor line 10.

The soliton thus created can make a right-handed turn or a left-handed turn, depending on the direction of the electric current and the direction of its travel can be in the direction Ff from left to right or in the reverse direction Fr with respect to the bearings of the figure. Only, as illustrated in the figure, the soliton So that has advanced toward the right-handed direction Fr is reflected at the terminal part of the multiband superconductor line 10 and eventually returned to the left-handed direction Ff.

The created soliton So, in the multiband superconductor line 10 that is characteristically continued stably, is enabled, while advancing in the left-handed direction Ff as illustrated in the figure, to continue its advance intact till it reaches the open circuit line part Ro regarding the electric current allowing no flow of the electric current Io. In this case, the soliton So passes the electrode 11-1 to which the electric current source 12 is connected and continues this passage under it because it is incapable of advancing into other metallic electrode, for example, than the multiband superconductor line. Meantime, as a matter of course, the electric current Io can flow through the closed circuit route including the closed circuit line part Rc and the electrodes 11-1 and 11-2 of the multiband superconductor line 10 and cannot flow in the open circuit line part Ro.

After all, by such a simple contrivance for the circuit device as illustrated in the figure, the soliton can be infallibly separated from the electric current Io.

Incidentally, by varying the areas respectively of the left and right electrodes 11-1 and 11-2, thereby precluding equivalence between the contact resistances of these electrodes relative to the multiband superconductor line 10, it is rendered possible to effect such control that only either of these electrode parts may be allowed to generate the soliton So. Then, by forming a non-ohmic barrier between the multiband superconductor line 10 and the electrodes, thereby enabling a large voltage to be generated even with the electric current of only a small magnitude, it is made possible to ensure efficient and infallible generation of the soliton So while the superonducting property of the multiband superconductor line 10 is retained intact.

Further, by lowering the contact resistances between the left and right electrodes 11-1 and 11-2 and the multiband superconductor line 10, thereby divesting the superconducting property of the closed circuit line parts Rc in the neighborhood of the electrodes, it is made possible to effect such control that the soliton So may be generated only by the left electrode 11-1, for example. Even by devising the configuration of the electrodes, it is made possible to select the electrode that is capable of generating the soliton So of the type allowing injection of a nonequivalent electric current.

In the case of the present circuit device, the detection of the generated soliton So is accomplished based on the following configuration.

So long as the soliton So is retained under a temperature environment falling short of the critical soliton temperature Tc2, the soliton So is in a topologically stable state. So, the Josephson junction 15 is disposed in the open circuit line part Ro and the soliton So is made to collide against the junction. Consequently, the soliton So enables injection of energy into the Josephson junction 15 and terminates its life while generating a voltage owing to the AC Josephson effect.

Now, the mechanism for the generation of the voltage by the AC Josephson effect will be described below by citing, for example, the RCSJ (Resistively and Capacitively shunted junction) model that is an equivalent circuit of the Josephson junction 15. A study has been already made on the ordinary RCSJ model and the dynamics thereof The seventh prior art reference ("Introduction to Superconductivity," Second Edition, Michael Tinkham, McGraw-Hill, Inc., Section 6.3), for example, may be consulted about pertinent information.

Figure 2A:
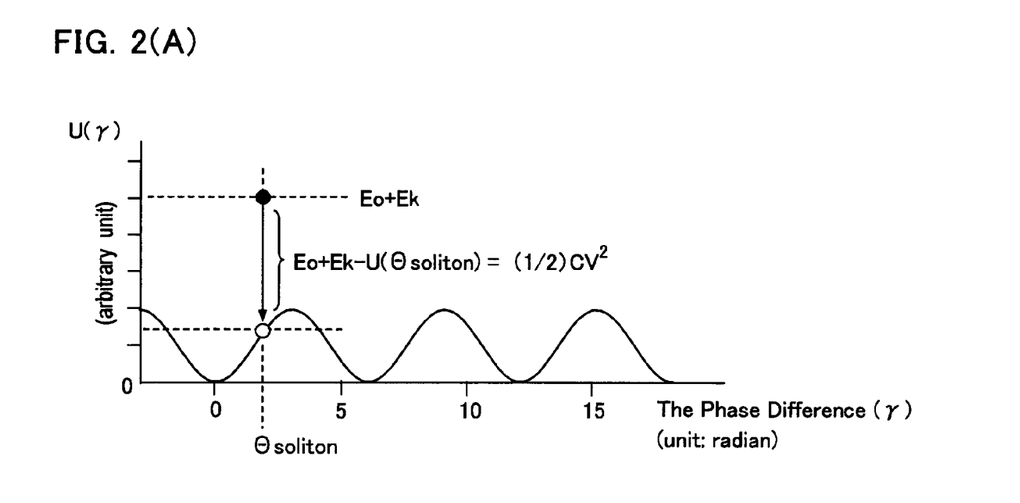
FIG. 2(A) is an energy diagram showing the relation between the phase difference and the magnitude of energy in the Josephson junction.

FIG. 2(A) is an energy diagram wherein the horizontal axis is the scale of the phase difference (unit: radian) in the Josephson junction and the vertical axis is the scale of the magnitude (arbitrary unit) of the energy in the Josephson junction. The cosine wave in FIG. 2(A) is the potential energy $U(\gamma)$ of the Josephson junction caused by the Josephson interaction and is expressed by the following formula (1), wherein $\gamma$ denotes the phase difference, h denotes the Planck's constant, $E_j$ denotes the constant of the interaction in the Josephson junction, I denotes the bias electric current, and e denotes the elementary electric charge.

$$U(\gamma) = -E_j \cos(\gamma) - (hI/4\pi e)\gamma \qquad (1)$$

The energy of the soliton So generated by the injection of quasi-particles is the sum of the rest energy $E_O$ and the kinetic energy $E_K$ of the soliton So and is indicated with the mark of a black circle in FIG. 2(A). When the soliton So vanishes on the Josephson junction 15, the soliton So transfers the phase difference $\Theta_{soliton}$ owned by itself onto the Josephson junction 15 and as well injects the energy owned by itself into the Josephson junction 15.

In the RCSJ model, the phase dynamics in the Josephson junction is regarded as equivalent to the motion of the mass point that is in motion on the cosine wave potential produced by the Josephson junction. This model is otherwise called a washboard model. In the ordinary washboard model, the "washboard potential" is tilted by the bias electric current (the tilted-washboard model). In the open circuit line part Ro of FIG. 1, however, since the bias electric current is zero, the potential energy in the Josephson junction of FIG. 1 is not tilted. That is, the washboard potential is not tilted. It turns out to be a so-called untilted-washboard model (=horizontal-washboard model).

Figure 2B:
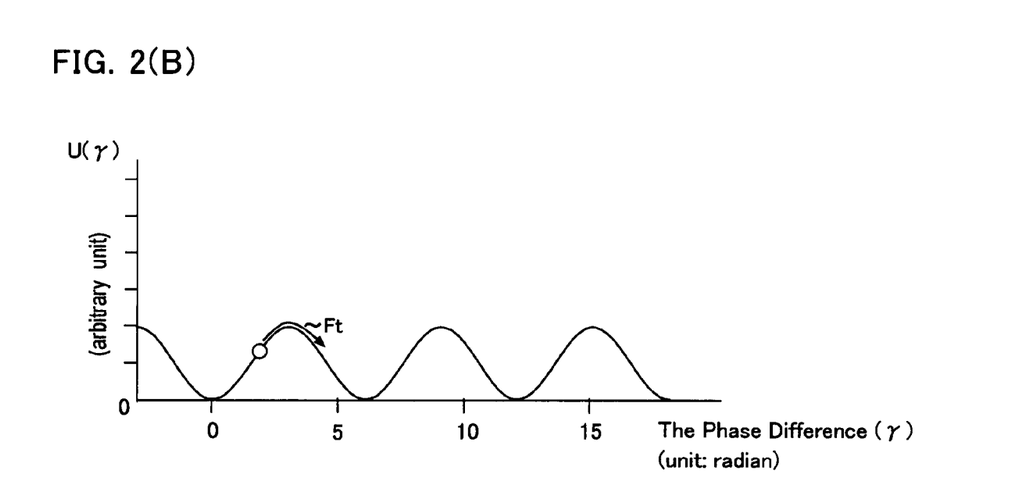
FIG. 2(B) is an explanatory diagram regarding the kinetic energy of the phase difference and the motion of the phase difference in the Josephson junction.

In the washboard model, when the energy of the soliton injected into the Josephson junction is larger than the Josephson binding energy, this excess becomes the kinetic energy $\{E_O + E_K - U(\Theta_{soliton})\}$, and this kinetic energy causes the phase difference in the Josephson junction to start cycling round and round. This scene is schematically depicted with an arrow mark Ft in FIG. 2(B).

When this phase difference is converted into the voltage by the following formula (2) pertaining to the AC Josephson junction, the result of the conversion can be determined with the voltage detecting device 13.

$$d\gamma/dt = 4\pi eV/h \qquad (2)$$

The instantaneous "kinetic energy" of the phase difference in the Josephson junction is expressed by the following formula (3).

$$(\tfrac{1}{2})CV^2 \qquad (3)$$

This formula corresponds to an expression that the phenomena of charge and discharge are repeated on the capacitor component in the Josephson junction part. Then, the question whether the phase first moves in the increasing direction or in the decreasing direction is decided by the diode component parasitizing the Josephson junction. When the diode component tends to collect the electric charge more on the right side of the Josephson junction, the phase begins to move to collect on that side.

Since the kinetic energy of the phase difference in the Josephson junction is equivalent to the injection of the electric charge by the capacitor component of the junction, this voltage can be observed as an average voltage even in the DC mode.

As regards the Josephson junction 15, the grain boundary that is not intentionally manufactured but has been spontaneously existing in a sample can be utilized as the Josephson junction 15. The Josephson function referred to in this invention embraces the grain boundary that is occurring in this situation. FIG. 43 entered in the eighth prior art reference ("Grain boundaries in high-Tc superconductors," H. Hilgenkamp, J. Mannhart, REVIEWS OF MODERN PHYSICS, VOLUME 74, (2002), pp. 485-549), for example, depicts the fact that in the case of a high-temperature superconductor, the capacity of the capacitor component of the grain boundary Josephson junction gains in accordance as the value of the critical electric current increases. In the case of determining the voltage, therefore, the use of the natural grain boundary that permits addition to the value of the critical electric current proves more advantageous.

In order that the principle of this invention described hitherto may effectively function, however, at least the part of the multiband superconductor line 10 must retain a stable superconducting state even when the soliton So has occurred and has been existing. For that purpose, the temperature condition to the effect that it suffices to retain the cooling temperature below the superconducting critical temperature Tc of the superconductive material of the multiband superconductor line 10 is not the only requirement. Rather, at least the part of the multiband superconductor line 10 must be cooled with a cooling device not shown in the figure to a lower temperature, i.e. to below the critical soliton temperature Tc2 at which the superconductivity in the central part of the soliton So is retained. Otherwise, the soliton circuit does not stably operate.

Though the critical soliton temperature Tc2 has been already covered by the study of the present inventors and others as reported in the first prior art reference, it will be briefly explained herein. The part in which the soliton So is present has a higher energy density than the part in which the soliton is absent. If the energy density is unduly high, therefore, the superconductivity will be damaged. In other words, if the increment of the energy density brought by the soliton exceeds the superconductor cohesive energy density, the soliton will become instable and a soliton device will become difficult to configure. Incidentally, the term "superconductor cohesive energy density" may be defined as ("the energy in the normal conducting state"—"the energy in the superconducting state"). Since the creation of the soliton results in giving a slightly higher energy than the superconducting ground state, the portion consequently increased may be defined as the increment of "energy density" brought by the soliton.

Since the central part of the soliton, namely the central part of the solitary wave forming a quantum, becomes the part that has the highest energy density, the temperature at which the "energy density" in the central part becomes smaller than the "superconductor cohesive energy density" is the "critical soliton temperature Tc2." In the case of the T1-1223, the Tc2 barely reaches a level of about 80 K in the absence of a magnetic field, which is quite lower than the superconducting critical temperature Tc (100 K or more) inherent in a material that does not need to consider the presence of a soliton. From the viewpoint of the requirement for the application of this invention, it is necessary that at least the multiband superconductor line part be placed at a temperature below the critical soliton temperature Tc2 as described above. Actually, for the purpose of ensuring infallible and stable presence of the soliton, it more often than not suffices to set the multiband superconductor line under a rather lower temperature environment than the temperature just mentioned, through experiments and so on. For example, the experiment conducted on this material by the present inventors was performed at 77 K.

An experiment that seems to resemble well, in terms of the structure of a device, an example of the construction of the circuit device illustrated in FIG. 1 is recognized as being disclosed in the ninth prior art reference ("Nonlocal In-Plane Resistance due to Vortex-Antivortex Dynamics in High-Tc Superconducting Films," Y. Kopelevich et al., Physical Review Letters, Vol. 80, May 4, 1998, pp. 4048-4051) and the tenth prior art reference ("Excess voltage in the vicinity of the superconducting transition in inhomogeneous $YBa_2Cu_3O_7$ thin film," F. Mrowk et al., Physics C 399 (2003) pp. 22-42). In either of the ninth and tenth prior art references, the cooling temperature barely reaches the neighborhood of the superconducting critical temperature Tc of the material. Since neither of them discloses the concept of lowering the temperature to the critical soliton temperature Tc2, the possibility that the soliton will be generated is nil.

The soliton cannot stably exist under the experimental conditions disclosed in the ninth and tenth prior art references. In fact, neither of them makes any explanation about the stability of the presence of the soliton. The devices that are disclosed in these prior art references, therefore, hardly allow production of any infallible and highly reliable circuit operation issuing from the presence of a soliton in conformity with this invention.

Figure 3A:
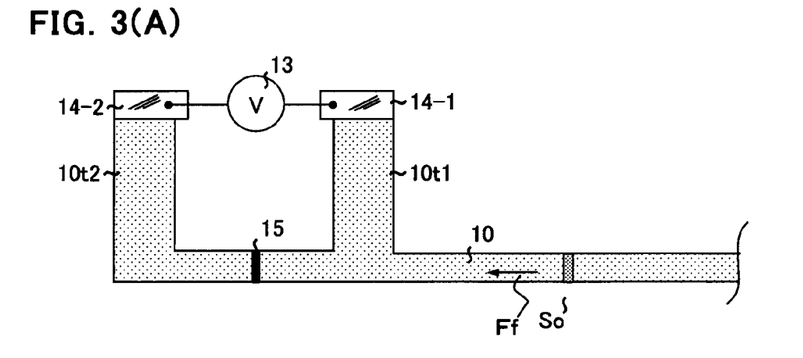
FIG. 3(A) is a structural diagram of the circuit device so configured that the lines 10t1 and 10t2 of the shape of teeth of a comb connected to the voltage detecting device 13 are given a larger width than the soliton traveling line part of the multiband superconductor line 10.

To refer to the circuit device illustrated in FIG. 1 till further fine points, the circuit illustrated in FIG. 1 is so contemplated that the electrodes 14-1 and 14-2 connected to the voltage detecting device 13 are after all prepared also with a proper metal, such as gold, and, when necessary, are made to interconnect the electrodes and the voltage detecting device 13 via a proper lead wire. Here, from the practical point of view, the electrodes and the lead wire part under discussion are formed by utilizing the multiband superconductor line 10 itself in the shape of lines 10t1 and 10t2 resembling teeth of a comb as illustrated in FIG. 3(A). The construction pertinent here is so contemplated that the soliton So having traveled in the Ff direction through the open circuit line part of the multiband superconductor line 10 reaches the Josephson junction 15 interposed between the lines 10t1 and 10t2 resembling a pair of teeth of a comb.

Figure 3B:
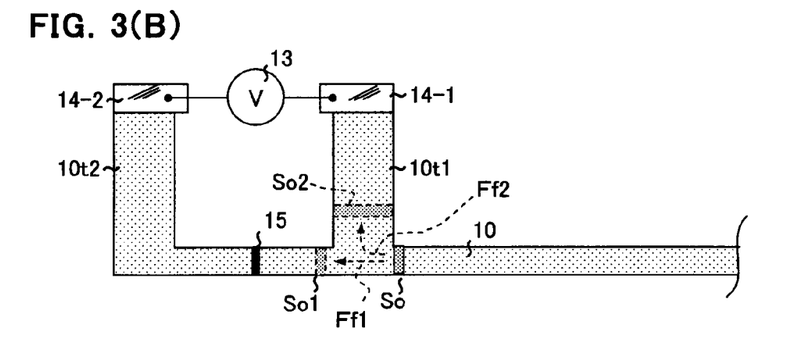
FIG. 3(B) is an explanatory diagram regarding the motion of the soliton after the soliton So reaches the line 10t1 in the shape of the first tooth of a comb in the circuit device of FIG. 3(A).

In this case, however, due attention must be paid to the possibility that the object of this invention may not be accomplished when the lines 10t1 and 10t2 resembling the teeth of a comb are given a width greater than the soliton traveling line part of the multiband superconductor line 10 as illustrated in the figure. Let us assume that the soliton So having traveled in the Ff direction through the multiband superconductor line 10 as illustrated in FIG. 3(A) has reached the line 10t1 resembling the first tooth of a comb. If the soliton So tends to advance further to the left side, the soliton So by its nature must make entry as divided both in an imaginary line direction Ff1 toward the line in which the Josephson junction 15 is disposed and in an imaginary line direction Ff2 toward the electrode 14-1 as schematically indicated by signs So1 and So2 in FIG. 3(B).

Figure 3C:
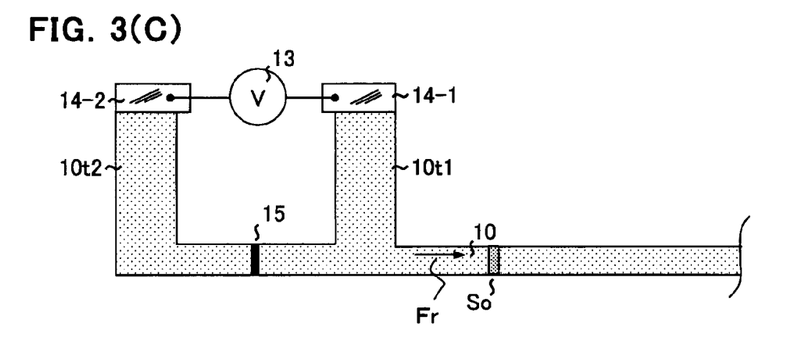
FIG. 3(C) is an explanatory diagram illustrating the state in which the soliton So reflects on the teeth-shaped line 10t1 and returns in the direction of the arrow mark Fr in the circuit device of FIG. 3(A).

Yet, the rest energy of the soliton So is in proportion to the cross-sectional area of the relevant line. If the total kinetic energy (the rest energy+the kinetic energy) of the soliton So falls short of the sum of rest energy of the two solitons So1 and So2 illustrated in FIG. 3(B), the soliton So will be no longer able to advance further to the left side toward the Josephson junction 15 and will reflect on the right side and eventually return in the direction of the arrow mark Fr as illustrated in FIG. 3(C). As a result, such a geometric structure as depicted must be avoided.

Figure 4:
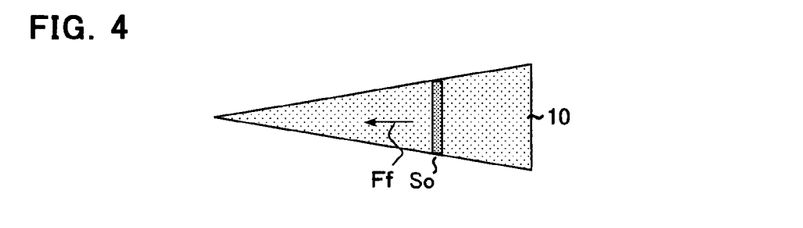
FIG. 4 is an explanatory diagram illustrating one preferred shape of the multiband superconductor line during the configuration of the soliton circuit of this invention.

Conversely, for the purpose of positively forwarding the generated soliton So toward the left side, the action of thinning the multiband superconductor line 10 in the direction of converging the soliton So intentionally as illustrated in FIG. 4 proves to be effective. Since the rest energy of the soliton So is in proportion to the cross-sectional area of the relevant line as described above, the soliton So dwindles in accordance as it moves to the left side. As a result, the soliton So tends to approach gradually toward the direction in which the rest energy is stabilized, namely to the left side. Then, when the soliton So enters a thin line part, the rest energy of the soliton So that corresponds to the difference in cross-sectional area between the thin line part and a thick line part is converted completely into the kinetic energy density in the thin line part. Since the soliton becomes easily collapsible when the average energy in the soliton part greatly exceeds the superconducting cohesive energy density, such a contrivance on the geometric shape as suggested above proves to be a structure that serves advantageously for the detection of voltage and can be freely adopted for that purpose.

Figure 5A:
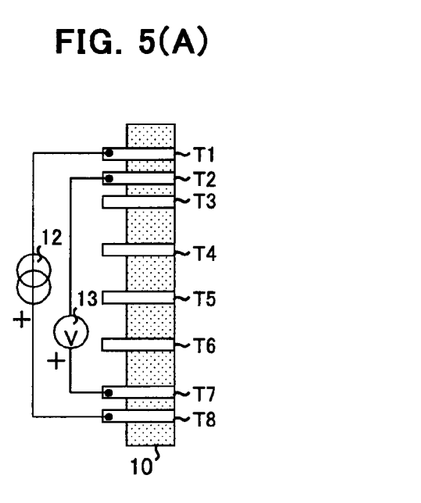
FIG. 5(A) is a schematic structural diagram of an experimental multiband superconductor line that is provided with the gold electrodes T1 to T8.

Now, the example will be described below by reference to FIG. 5 and FIG. 6. First, the experimental multiband superconductor line 10 illustrated in FIG. 5(A) was constructed by forming $Tl(Ba, Sr)_2Ca_2Cu_3O_y$ (T1 -1223) in the shape of a thin film on a $SrTiO_3$ substrate measuring 0.5 mm in thickness. The line had a thickness of about 400 nm. A plurality of gold electrodes T1 to T8 were applied onto the line by the sputtering method. The multiband superconductor line measured 2 mm in width and 10 mm in length. The widths of the gold electrodes T1 to T8 were each 0.5 mm and the gaps between T3 and T4, T4 and T5, T5 and T6 and T6 and T7 were each 0.8 mm and the other gaps were each 0.4 mm. As the Josephson junction, the grain-boundary bonding that spontaneously existed in the sample was adopted.

Figure 5B:
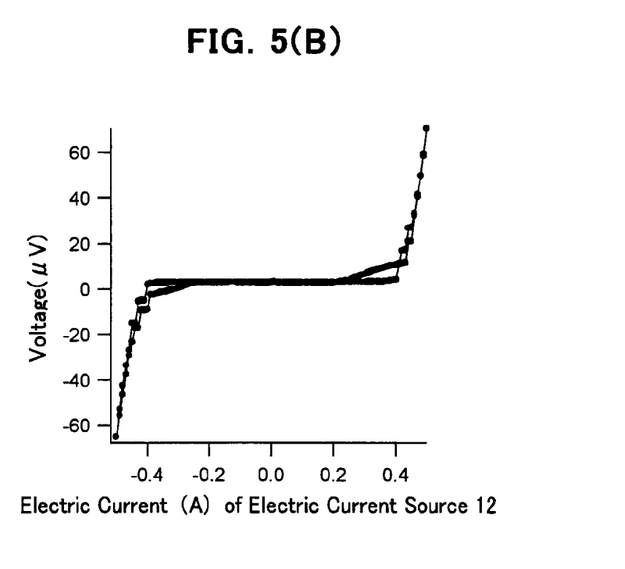
FIG. 5(B) is a diagram showing the results of the determination regarding the critical electric current of the experimental multiband superconductor line of FIG. 5(A).

This circuit device was directly immersed in liquefied nitrogen (naturally allowing it to reach a temperature below the critical soliton temperature Tc2), the electric current source 12 was made to interconnect the electrodes T1 and T2, and the voltage between the electrodes T2 and T7 was kept monitored by way of measuring the critical electric current of the experimental multiband superconductor line 10. The results were as shown in FIG. 5(B), which allowed confirmation that the multiband superconductor line 10 assumed the superconducting state.

Figure 6A:
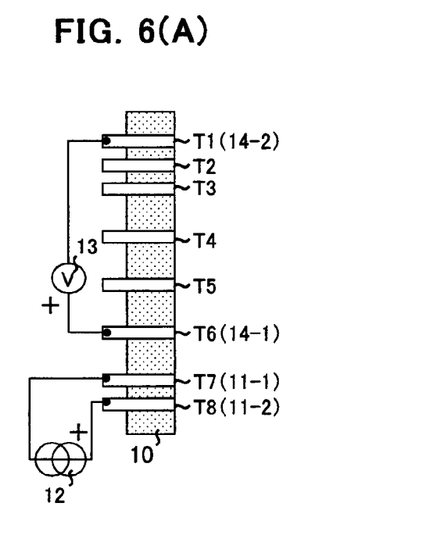
FIG. 6(A) is a schematic diagram of the interband phase difference soliton circuit configured by using the experimental multiband superconductor line of FIG. 5(A).

Then, the electric current source 12 was made to interconnect the electrodes T7 and T8 to form a closed circuit line part as illustrated in FIG. 6(A), with a view to verifying the circuit device of this invention. Incidentally, the electrodes T7 and T8 corresponded respectively to the electrodes T11-1 and 11-2 shown in FIG. 1. And the electrodes T1 and T6 corresponded respectively to the electrodes T14-2 and 14-1 shown in FIG. 1 and were enabled to form an open circuit line part. The presence or absence of the generation of a voltage by the soliton was confirmed by making the interconnection of the electrodes T1 and T6 with the voltage detecting device 13 and injecting a nonequilibrium electric current via the electric current source 12. The voltage was confirmed by reading the averaged generated voltage that was indicated on a DC voltmeter.

Figure 6B:
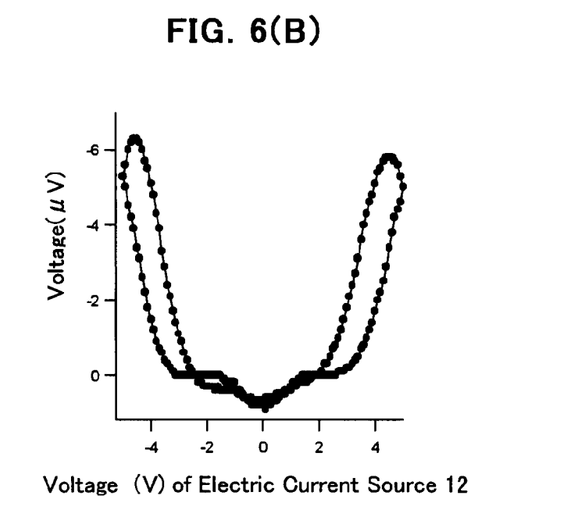
FIG. 6(B) is an explanatory diagram regarding the verification of the motion of the soliton circuit of FIG. 6(A).

As a result, a voltage was observed in the open circuit line part in which no voltage could be generated in the absence of a soliton, as illustrated in FIG. 6(B). That is, it was verified that the circuit device of this invention could infallibly function as an effective soliton circuit.

Incidentally, in the circuit structure illustrated in FIG. 1, the one electrode 11-2 to which the electric current source 12 is connected is disposed at the same position as one end portion of the length of the multiband superconductor line 10. In other words, though the multiband superconductor line is not present on the farther right side from the position at which the electrode 11-2 is disposed in the figure, there is no particular reason for having the electrode 11-2 disposed in the end portion of the line 10. The electrode 14-2 also may be disposed halfway along the length of the multiband superconductor line 10. In this case, the open circuit line part Ro may be present, on either side of the circuit line part Rc. The voltage detecting device 13 may be disposed on either of the two open circuit line parts and the soliton that has entered the open circuit line part on the opposite side is eventually reflected and returned. In the other respects, too, this invention may be freely altered within the scope of the spirit thereof.

What is claimed is:

1. A method for generating an interband phase difference soliton, comprising:

using part of a length portion of a multiband superconductor line as a closed circuit line part that is part of a closed circuit for running an electric current generated by an electric current source;

using a line part of said multiband superconductor line continuously extending to said closed circuit line part as an open circuit line part fated to serve as an open circuit with respect to said electric current source; and placing said multiband superconductor line under a temperature environment below a critical soliton temperature lower than a superconducting critical temperature of said multiband superconductor line, thereby injecting a nonequilibrium electric current from said electric current source into said closed circuit line part of said multiband superconductor line to induce generation of an interband phase difference soliton as separated from the electric current to said open circuit line part of said multiband superconductor line.

2. A method for detecting an interband phase difference soliton, including the method according to claim 1 and further comprising the steps of:

forwarding the separated interband phase difference soliton to said open circuit line part of said multiband superconductor line to cause the soliton to run in said open circuit line part;

providing said open circuit line part with a Josephson junction; and causing extinction of said interband phase difference soliton subsequent to its arrival at said Josephson junction and, at the time of said extinction, detecting a voltage generated in consequence of an AC Josephson effect, thereby enabling detection of said interband phase difference soliton.

3. An interband phase difference soliton circuit, comprising:

a multiband superconductor line possessing a length;

a pair of electrodes disposed as mutually separated in a portion of the length of said multiband superconductor line;

an electric current source connected to said pair of electrodes;

an open circuit line part forming a portion of the length of said multiband superconductor line, disposed as continued to a closed circuit line part fated to serve as part of a closed circuit relative to said electric current source, and adapted to form an open circuit relative to said electric current source;

a Josephson junction disposed in said open circuit line part;

a voltage detecting means adapted to detect voltage generated in said Josephson junction; and means for cooling said multiband superconductor line to below a critical soliton temperature that is lower than a superconducting critical temperature.

\* \* \* \* \*